(12) United States Patent
Kikuchi et al.

(10) Patent No.: US 6,897,525 B1
(45) Date of Patent: May 24, 2005

(54) SEMICONDUCTOR DEVICE AND METHOD OF MANUFACTURING THE SAME

(75) Inventors: Shuichi Kikuchi, Gunma (JP); Yumiko Akaishi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/444,819

(22) Filed: Nov. 22, 1999

(30) Foreign Application Priority Data

Nov. 26, 1998 (JP) .......................................... 10-335877
Dec. 4, 1998 (JP) .......................................... 10-345651
Dec. 10, 1998 (JP) .......................................... 10-351779

(51) Int. Cl.[7] .................. H01L 27/148; H01L 29/68; H01L 29/76; H01L 29/94; H01L 31/062
(52) U.S. Cl. .................. 257/343; 257/409; 257/491; 257/492; 257/493; 438/268; 438/273
(58) Field of Search .................. 257/343, 409, 257/335, 491, 336, 992, 493, 344; 438/268, 273

(56) References Cited

U.S. PATENT DOCUMENTS

| | | | | |
|---|---|---|---|---|
| 5,041,895 A | * | 8/1991 | Contiero et al. .............. 357/43 |
| 5,242,841 A | * | 9/1993 | Smayling et al. .............. 437/29 |
| 5,382,536 A | * | 1/1995 | Malhi et al. .................. 437/41 |
| 5,583,365 A | * | 12/1996 | Villa et al. ................... 257/409 |
| 5,869,371 A | * | 2/1999 | Blanchard .................... 438/268 |
| 5,907,173 A | * | 5/1999 | Kwon et al. ................. 257/336 |
| 5,949,105 A | * | 9/1999 | Moslehi ....................... 257/336 |
| 6,127,700 A | * | 10/2000 | Bulucea ....................... 257/335 |
| 6,157,062 A | * | 12/2000 | Vasanth et al. .............. 257/336 |
| 6,207,518 B1 | * | 3/2001 | Akaishi et al. .............. 438/301 |

FOREIGN PATENT DOCUMENTS

JP  A-09-139438  5/1997  ....... H01L/21/8249

* cited by examiner

*Primary Examiner*—Long Pham
*Assistant Examiner*—Shrinivas Rao
(74) *Attorney, Agent, or Firm*—Fish & Richardson P.C.

(57) ABSTRACT

In order to improve the characteristics of the high breakdown voltage MOS, a semiconductor device of the present invention is characterized in that an LDMOS transistor, which comprises a source region 4, a channel region 8, and a drain region 5, and a gate electrode 7 formed on the channel region 8, and a drift region formed between the channel region 8 and the drain region 5, wherein an N⁻-type low concentration layer 22 serving as the drift region is formed shallowly at least below the gate electrode 7 (first N⁻-type layer 22A) but formed deeply in a neighborhood of the drain region 5 (second N⁻-type layer 22B).

18 Claims, 22 Drawing Sheets

N-CLAMP VOLTAGE VS. Na CONCENTRATION
STEPPED JUNCTION N-CONCENTRATION $1 \times 10^{17}/cm^3$
$Xj = 0.2\mu m$

SEMICONDUCTOR DEVICE AND METHOD OF MANUFACTURING THE SAME

BACKGROUND OF THE ART

1. Technical Field

The present invention relates to a semiconductor device and a method of manufacturing the same and, more particularly, a technology for an LD (Lateral Double Diffused) MOS transistor as a high voltage element employed in a liquid crystal driving IC, etc., for example.

2. Related Art of the Invention

In the LDMOS transistor structure, a new diffusion region is formed by diffusing a different conductivity type impurity into a diffusion region formed on the surface side of a semiconductor substrate, and then a difference in lateral diffusion lengths of these diffusion regions is utilized as an effective channel length. Thus, since a short channel can be formed, the LDMOS transistor is suitable for the low ON-resistance device.

FIG. 18 is a sectional view showing the LDMOS transistor in the prior art. The N-channel LDMOS transistor structure is shown as an example. In this case, although explanation of the P-channel LDMOS transistor structure is omitted, it is well known that the P-channel LDMOS transistor structure has the similar structure except for the different conductivity type.

In FIG. 18, 1 denotes one conductivity type, e.g., P-type semiconductor substrate, and 2 denotes an N-type well region. A P-type body region 3 is formed in the N-type well region 2, and then an N-type diffusion region 4 is formed in the P-type body region 3. An N-type diffusion region 5 is also formed in the N-type well region 2. A gate electrode 7 is formed on a gate insulating film 6 on the surface of the substrate. A channel region 8 is formed on a surface region of the P-type body region 3 immediately below the gate electrode 7.

Then, the N-type diffusion region 4 acts as a source region, the N-type diffusion region 5 acts as a drain region, and the N-type well region 2 located under a LOCOS oxide film 9A acts as a drift region. Then, 10 and 11 denote a source electrode and a drain electrode respectively, 12 denotes a P-type diffusion region for supplying the potential to the P-type body region 3, and 13 denotes an interlayer insulating film.

In the above LDMOS transistor, since the N-type well region 2 is formed by diffusing the impurity, the impurity concentration of the surface of the N-type well region 2 is increased. Thus, the current is ready to flow through the surface of the N-type well region 2, and also the higher breakdown voltage can be achieved. Then, the LDMOS transistor having such configuration is called a REduced SRface (RESURF) type LDMOS, and a dopant concentration in the drift region of the N-type well region 2 is set to satisfy RESURF conditions. Such technology is disclosed in JPA (Patent Application Publication (KOKAI) Hei 9-139438, etc.

However, as shown in FIG. 18, since the N-type well region 2 is formed uniformly up to the same depth position, it prevents the higher breakdown voltage and the reduction in ON-resistance.

In addition, as shown in FIG. 20, in the case that a plurality of LDMOS transistors having the above structure are arranged via a element isolation film 9B, the element isolation films 9B to isolate the adjacent transistors are increased in size to thus prevent the higher integration. In other words, the N-type well regions 2 which are positioned adjacently via the element isolation film 9B have the large lateral spread since they are formed by the well-known well diffusion step, and also the depletion layer widely spreads. Hence, the element isolation film 9B needs an L2 (about 10 μm to 30 μm) size, for example.

Further, as shown in FIG. 19A, there is provided a device constituted by the P-channel high breakdown voltage MOS transistor (Pch MOS Tr) and the N-channel LDMOS transistor (Nch DMOS Tr) as a CMOS circuit which can achieve the high breakdown voltage. In this case, as shown in FIG. 19B, in the P-channel high breakdown voltage MOS transistor, an N-type well region 51 is formed on a one conductivity type, e.g., P-type semiconductor substrate 1, then a gate electrode 57 is formed on a surface of the N-type well region 51 via a gate insulating film 56, then P-type low concentration diffusion regions 54A, 54B are formed on a substrate surface layer to be adjacent to the gate electrode 57, and then P-type high concentration diffusion regions 55A, 55B are formed in the P-type diffusion regions 54A, 54B. The P-type diffusion regions 54A, 55A act as a source region, and the P-type diffusion regions 54B, 55B act as a drain region.

Then, the CMOS structure is constructed by such P-channel high breakdown voltage MOS transistor and the foregoing N-channel LDMOS transistor.

However, in the CMOS structure in the prior art the process for manufacturing the N-channel LDMOS transistor cannot be sufficiently used.

SUMMARY OF THE INVENTION

Therefore, a first object of the present invention is to provide a semiconductor device which is responsible to requests for the higher breakdown voltage and the reduction in its ON-resistance, and a method of manufacturing the same.

Therefore, a second object of the present invention is to provide a semiconductor device which is responsible to requests for the higher breakdown voltage and the reduction in its ON-resistance and also enables the higher integration density, and a method of manufacturing the same.

Therefore, a third object of the present invention is to provide a semiconductor device which makes it possible to improve the characteristics of the P-channel high breakdown MOS transistor by using practically and sufficiently fabrication processes for the N- channel LDMOS transistor without causing the increase in the number of manufacturing steps, and a method of manufacturing the same.

Accordingly, in order to achieve the above first object, as shown in FIG. 1, the present invention is characterized by providing a semiconductor device, for example, an N-channel LDMOS transistor, which comprises a source region 4, a channel region 8, and a drain region 5, and a gate electrode 7 formed on the channel region 8, and a drift region formed between the channel region 8 and the drain region 5, wherein an N$^-$-type low concentration layer 22 serving as the drift region is formed shallowly at least below the gate electrode 7 (first N$^-$-type layer 22A) but formed deeply in a neighborhood of the drain region 5 (second N$^-$-type layer 22B).

In this manner, a RESURF effect can be improved by forming the drift region shallowly under the gate electrode 7.

Then, as shown in FIG. 2A, a method of manufacturing the semiconductor device of the present invention comprises following steps. Two kind N-type impurities (for example, arsenic ion and phosphorus ion) are ion-implanted to form an N⁻-type layer 22 serving as a drift region in a P-type well region 21 in a P-type semiconductor substrate 1. Then, as shown in FIG. 2B, a LOCOS oxide film 9 is formed by oxidizing selectively a certain region on the substrate 1, and the N-type low concentration layer 22A, 22B is formed at a relatively deep position in the P-type well region 21 and on a surface layer of the substrate 1 by using a difference in diffusion coefficients of the arsenic ion and the phosphorus ion respectively. Then, as shown in FIG. 3A, a P-type impurity (for example, boron ion) is ion-implanted and diffused into the surface layer of the substrate 1 in a source forming region by using a photoresist film 39 which is formed on a drain forming region on the substrate 1 as a mask so as to cancel the N⁻-type layer 22B formed at the relatively deep position in the P-type well region 21 in the source forming region by a diffusion of the boron ion.

Then, as shown in FIG. 3B, a gate insulating film 6 is formed on the substrate 1, then a gate electrode 7 is formed to extend from the gate insulating film 6 to the LOCOS oxide film 9, and then as shown in FIG. 4A, a P-type body region 3 is formed adjacently to one end portion of the gate electrode 7 by implanting and diffusing the P-type impurity (for example, boron ion) by using a photoresist film 40 which is formed to cover the gate electrode 7 and the drain forming region as a mask. Then, as shown in FIGS. 4B and 5A, an N-type diffusion region 4, 5 serving as a source/drain region is formed by implanting the N-type impurities (for example, phosphorus ion and arsenic ion) into the source forming region and the drain forming region formed in the P-type body region 3 by using a photoresist film 41, 44 as a mask.

Further, in order to achieve the above second object, the present invention is characterized by providing a semiconductor device, for example, as shown in FIG. 8, the N-channel LDMOS transistor, comprising a plurality of parallel-aligned structures, each of which including a source region 4, a channel region 8, and a drain region 5, and a gate electrode 7 formed on the channel region 8, and an N⁻-type layer 22 (drift region) which is formed shallowly at least below the gate electrode 7 between the channel region 8 and the drain region 5 (first N⁻-type layer 22A) but formed deeply in a neighborhood of the drain region 5 (second N⁻-type layer 22B), via a element isolation film 9B, wherein a channel stopper layer 38 is formed under the element isolation film 9. As a result, improvement of the RESURF effect and the higher integration can be achieved by forming the drift region shallowly under the gate electrode 7.

Then, a method of manufacturing a semiconductor device of the present invention comprises following steps as shown in FIG. 9 as an embodiment. Two kind N-type impurities (for example, arsenic ion and phosphorus ion) are ion-implanted to form the N⁻-type layer 22 serving as the drift region in the P-type well region 21 in the P-type semiconductor substrate 1. Then, as shown in FIG. 10, a silicon nitride film 34 serving as a mask in LOCOS-oxidizing via postprocessing is formed on the substrate 1, and then the P-type impurity (for example, boron ion) is ion-implanted into a surface the substrate by using a photoresist film 36 which is formed to cover the silicon nitride film 34 as a mask as shown in FIG. 11. Then, a first LOCOS oxide film 9A and a second LOCOS oxide film 9B are forming by oxidizing selectively certain regions on the substrate by using the silicon nitride film 34 as a mask, and the N⁻-type low concentration layer 22A, 22B is formed at a relatively deep position in the P-type well region 21 and on a surface layer of the substrate 1 respectively by using a difference in diffusion coefficients of two kind N-type impurities (for example, arsenic ion and phosphorus ion), and then a channel stopper layer 38 is formed under the second LOCOS oxide film 9B. Then, as shown in FIG. 12, the first conductivity type impurity is ion-implanted and diffused into the surface layer of the substrate 1 in the source forming region by using a photoresist film 39 which is formed in the drain forming region on the substrate 1 as a mask so as to cancel the N⁻-type layer 22B formed at the relatively deep position in the P-type well region 21 in the source forming region by the diffusion of the boron ion. Then, as shown in FIG. 13, the gate insulating film 6 is formed on the substrate 1, then the gate electrode 7 is formed so as to extend from the gate insulating film 6 to the first LOCOS oxide film 9A, and then the P-type body region 3 is formed adjacently to one end portion of the gate electrode 7 by implanting and diffusing the P-type impurity by using a photoresist film 40 which is formed to cover the gate electrode 7 and the drain forming region as a mask. Then, as shown in FIG. 16, an N-type diffusion region 4, 5 serving as the source/drain region is formed by implanting the N-type impurities (for example, phosphorus ion and arsenic ion) into the source forming region and the drain forming region formed in the body region 3 by using a photoresist film 42 as a mask (FIG. 15).

Further, in order to achieve the above third object, as shown in FIG. 5, the present invention is characterized by providing a semiconductor device which includes an N-channel LDMOS transistor (A) having a source region 4, a channel region 8, a drain region 5, a gate electrode 7 formed on the channel region 8, and a drift region formed of an N⁻-type layer 22 between the channel region 8 and the drain region 5, and a P-channel high breakdown voltage MOS transistor (B) having a source region 54, a channel region 58, a drain region 55, and a gate electrode 57 formed on the channel region 58, wherein the drift region (N⁻-layer 22) in the N-channel LDMOS transistor (A) is formed shallowly at least below the gate electrode 7 (first N⁻-type layer 22A) but formed deeply in a neighborhood of the drain region 5 (second N⁻-type layer 22B). In addition, a source/drain region 54, 55 of the P-channel high breakdown voltage MS transistor (B) consists of a low concentration source/drain region 54A, 55A, a high concentration source/drain region 54B, 55B, and a middle concentration source/drain region 54C, 55C.

Moreover, as shown in FIG. 2A, a method of manufacturing the semiconductor device of the present invention comprises following steps. A photoresist film 31 which has an opening portion 31a over a part of a P-type well region 21 on a P-type semiconductor substrate 1 on which the P-type well region 21 and an N-type well region 51 is formed, and then two kind second conductivity type impurities (for example, arsenic ion and phosphorus ion) having a different diffusion coefficient are ion-implanted by using the photoresist film 31 as a mask. Then, as shown in FIG. 2B, a silicon nitride film 34 is formed in a certain region on the substrate 1, then a LOCOS oxide film 9 is formed by oxidizing selectively the substrate 1 by using the silicon nitride film 34 as a mask, and N⁻-type layers 22B, 22A are formed at a relatively deep position in the P-type well region 21 and on a surface layer of the substrate 1 by using a difference in diffusion coefficients of two kind N-type impurities respectively. Then, as shown in FIG. 3A, a P-type impurity (for example, boron ion) is ion-implanted and diffused into a source forming region in the P-type well region 21 and the surface layer of the substrate 1 in a source/drain forming region in the N-type well region 51 by using a photoresist film 39 which has opening portions 39a over the source forming region in the P-type well region 21 and the source/drain forming region in the N-type well region 51 as a mask so as to cancel the N⁻-type layer 22B formed at the relatively deep position in the source forming region in the P-type well region 21 by a diffusion of the boron ion and to form a P-type low concentration source/drain region 54A, 55A. Then, as shown in FIG. 3B, a first gate insulating film 6 is formed in a region other than the LOCOS oxide film 9 on the P-type well region 21, then a second gate insulating film 56 is formed in a region other than the LOCOS oxide film 9 on the N-type well region 51, and then a first gate electrode 7 and a second gate electrode 57 are formed on the first gate insulating film 6 and the second gate insulating film 56 respectively. Then, as shown in FIG. 4A, the first conductivity type impurity (for example, boron ion) is ion-implanted and diffused by using a photoresist film 40 which covers the first gate electrode 7 in the P-type well region 21 and the drain forming region and has an opening portion 40a over a part of the source/drain forming region on the N-type well region 51 as a mask, so as to form a P-type body region 3 adjacently to one end portion of the first gate electrode 7 and to form a P-type middle concentration source/drain region 54C, 55C in a region separated from the second gate electrode 57. Then, as shown in FIG. 4B, an N-type low concentration source region 4A is formed by ion-implanting the N-type impurity (for example, phosphorus ion) by using a photoresist film 41 which has an opening portion 41a located over the source forming region in the P-type well region 21 as a mask. Then, sidewall spacer films 43 are formed on side wall portions of the first gate electrode 7 and the second gate electrode 57, and then as shown in FIG. 5A an N-type high concentration source/drain region 4B, 5B is formed by ion-implanting the N-type impurity (for example, arsenic ion) by using a photoresist film 44 which having an opening portion 44a located over the source/drain forming region in the P-type well region 21 as a mask. Then, as shown in FIG. 5B a P-type high concentration source/drain region 54B, 55B is formed by implanting the P-type impurity (for example, boron difluoride ion) by using a photoresist film 45 having at least an opening portion 45a which is located over the N-type well region 51 and is smaller than at least the P-type middle concentration source/drain region 54C, 55C as a mask.

DESCRIPTION OF THE PREFERRED EMBODIMENT

A semiconductor device and a method of manufacturing the same according to a first embodiment of the present invention will be explained with reference to the accompanying drawings hereinafter.

Figure 1:
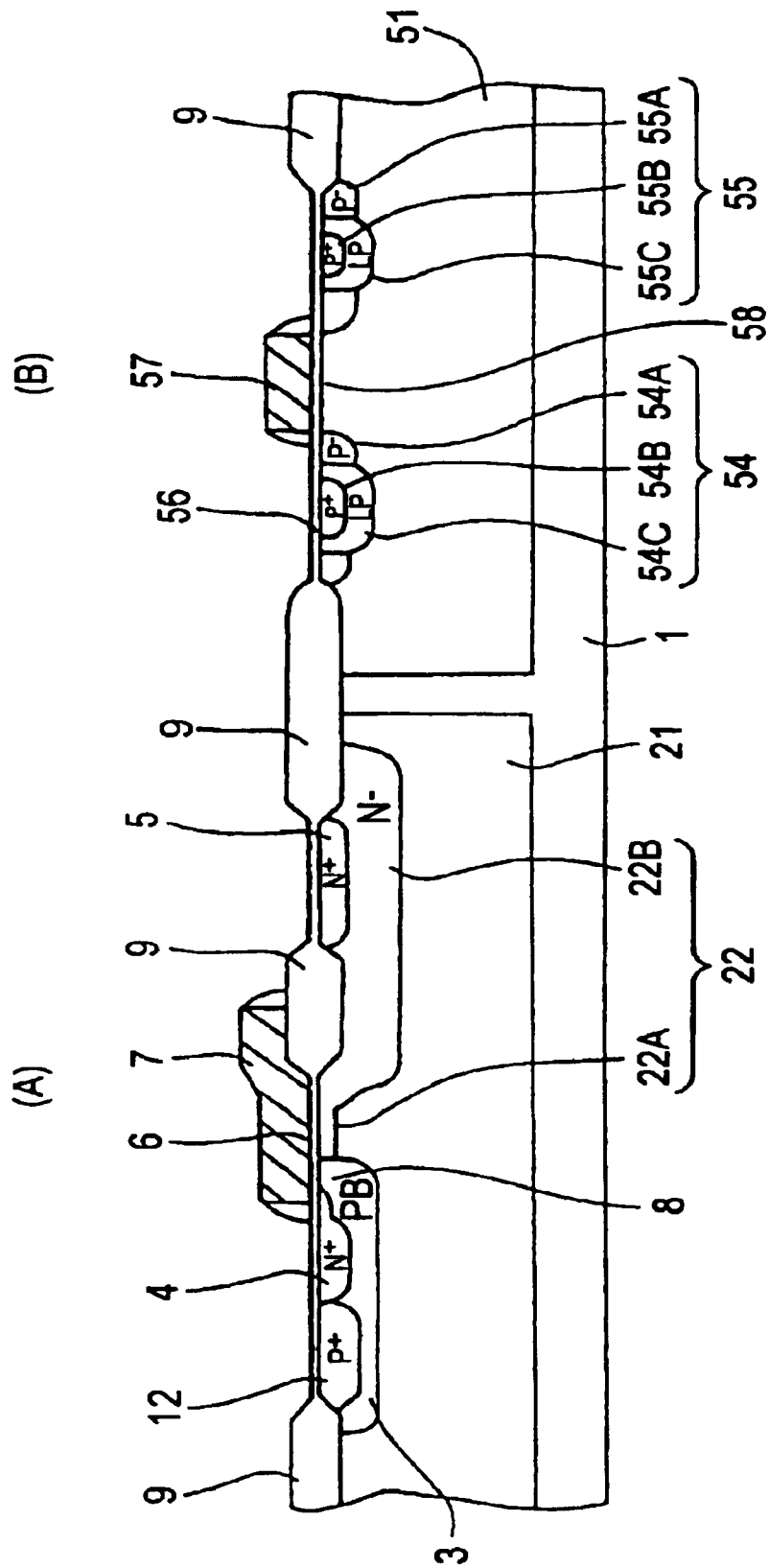
FIG. 1 is a sectional view showing a semiconductor device manufacturing method according to a first embodiment of the present invention.

FIG. 1 is a sectional view showing the semiconductor device and the method of manufacturing the same according to the first embodiment of the present invention. A configuration consisting of the N-channel LDMOS transistor (A) and the P-channel high breakdown voltage MOS transistor (B) is shown as an example. In this case, same symbols are affixed to constituent elements similar to those in the prior art, and their explanation will be simplified.

In FIG. 1, 1 denotes one conductivity type, e.g., P-type semiconductor substrate, and 21 denotes a P-type well region. An N⁻-type layer 22 as well as the P-type body region (PB) 3 is formed in the P-type well region 21. The N-type diffusion region 4 is formed in the P-type body region 3, and the N-type diffusion region 5 is also formed in the N⁻-type layer 22. The gate electrode 7 is formed on the surface of the substrate via the gate insulating film 6. The channel region 8 is formed on the surface region of the P-type body region 3 immediately below the gate electrode 7.

Then, the N-channel LDMOS transistor (A) is constructed in which the N-type diffusion region 4 acts as the source region, the N-type diffusion region 5 acts as the drain region, and the N⁻-type layer 22 located under the LOCOS oxide film 9 acts as the drift region. The P-type diffusion region 12 for supplying the potential to the P-type body region 3 is formed adjacently to the N-type diffusion region 4. The N⁻-type layer 22 formed in the P-type well region 21 is formed shallowly below the gate electrode 7 (first N⁻-type layer 22A) and is formed deeply in the neighborhood of the N-type diffusion region (drift region) 5 (second N⁻-type layer 22B). According to such configuration, the higher breakdown voltage and the lower ON-resistance of the N-channel LDMOS transistor (A) can be achieved. More particularly, since the concentration of the first N⁻-type layer 22A being formed shallowly below the gate electrode 7 is set high, the ON-resistance can be reduced and also the current flow can be made easy. While, since the concentration of the second N⁻-type layer 22B being formed in the neighborhood (drift region position) of the N-type diffusion region (drift region) 5, the depletion layer can be easily extended and also the high breakdown voltage can be achieved (see the concentration distribution shown in FIG. 6). The N-channel LDMOS transistor of the first embodiment has the breakdown voltage of about 30 V.

Then, 51 denotes an N-type well region. A gate electrode 57 is formed on a surface of the substrate over the N-type well region 51 via a gate insulating film 56. A channel region 58 is formed in a surface region immediately below the gate electrode 57. Then, P-type diffusion regions 54, 55 are formed to be adjacent to the gate electrode 57. The P-channel high breakdown voltage MOS transistor (B) using the P-type diffusion region 54 as the source region and the P-type diffusion region 55 as the drain region is constructed. The P-type diffusion regions 54, 55 consist of P-type low concentration diffusion regions 54A, 55A, P-type middle concentration diffusion regions 54C, 55C, and P-type high concentration diffusion regions 54B, 55B respectively. The P-channel high breakdown voltage MOS transistor of the first embodiment has the breakdown voltage of about 30 V.

Although their explanation will be omitted hereinbelow, a source electrode and a drain electrode are formed to come into contact with the N-type diffusion regions 4, 5 and the P-type diffusion regions 54, 55 after the overall surface has been covered with an interlayer insulating film.

A feature of the present invention resides in that the P-type middle concentration diffusion regions 54C, 55C (LP) constituting the P-type diffusion regions 54, 55 of the P-channel high breakdown voltage MOS transistor (B) can be formed by the same step as the ion-implantation step to form the P-type body region 3 in DMOS transistor forming steps when the N-channel LDMOS transistor (A) and the P-channel high breakdown voltage MOS transistor (B) are formed as above. Then, because such P-type middle concentration diffusion regions 54C, 55C are formed, the lower ON-resistance of the P-channel high breakdown voltage MOS transistor (B) can be achieved rather than the structure in the prior art. In addition, since the ion-implantation step in steps of manufacturing the N-channel LDMOS transistor (A) may be used as the concerned step, the number of manufacturing steps is never increased uselessly.

The method of manufacturing the semiconductor device mentioned above will be explained with reference to the drawings hereunder.

Figure 2A:
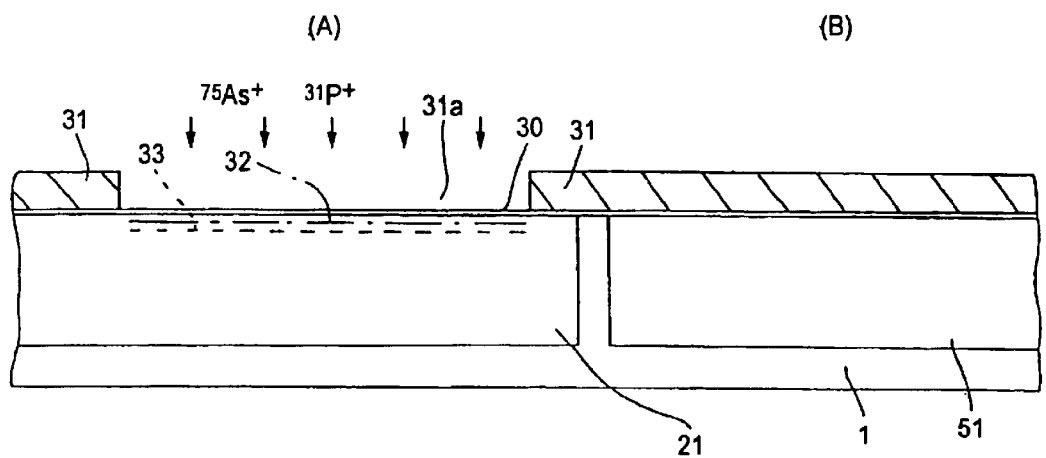
FIGS. 2A and 2B are sectional views showing a semiconductor device manufacturing method according to the first embodiment of the present invention.

In FIG. 2A, a P-type well 21 and an N-well 51 are formed in the P-type semiconductor substrate, then a pad oxide film 30 is formed thereon, and then first and second ion-implantation layers 32, 33 are formed by ion-implanting two kind N-type impurities (e.g., an arsenic ion and a phosphorus ion) while using a photoresist film 31, which has an opening portion 31a within the P-type well 21, as a mask so as to form the N⁻-type layer 22 acting as the drift region by the postprocessing. As the ion-implanting conditions of this step, for example, the arsenic ion is implanted by the accelerating voltage of about 160 KeV at a dose of $3\times10^{12}$/cm², and the phosphorus ion is implanted by the accelerating voltage of about 50 KeV at a dose of $4\times10^{12}$/cm².

Figure 2B:
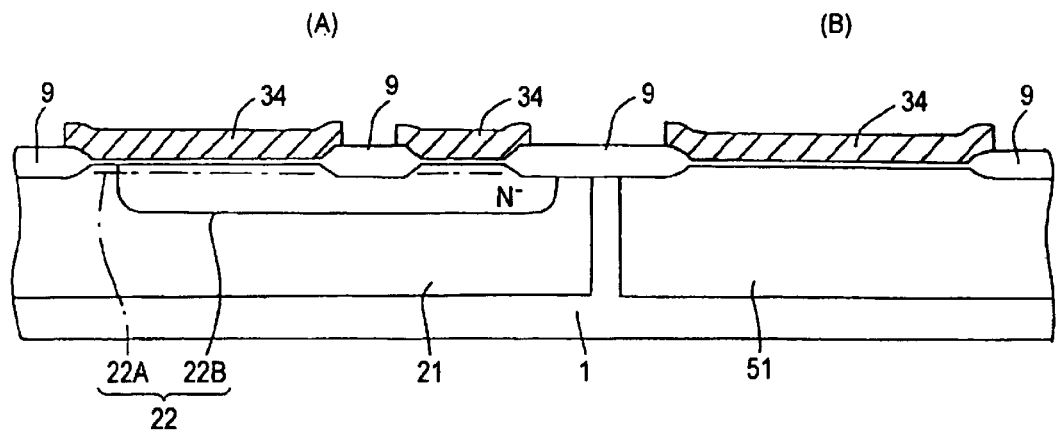

Then, as shown in FIG. 2B, the LOCOS oxide film 9 of about 7300 Å thickness is formed by selectively oxidizing the surface of the substrate with using a silicon nitride film 34 formed on the substrate 1 as a mask. Also, owing to difference in diffusion coefficients of the arsenic ion and the phosphorus ion which have been implanted into the surface layer of the substrate as described above, the arsenic ion is diffused into the substrate 1 and thus the first N⁻-type layer 22A is formed at a relatively shallow position in the surface layer of the substrate. Also, because the phosphorus ion is diffused into the substrate 1, the second N⁻-type layer 22B is formed at a relatively deep position in the P-type well region 21.

Figure 3A:
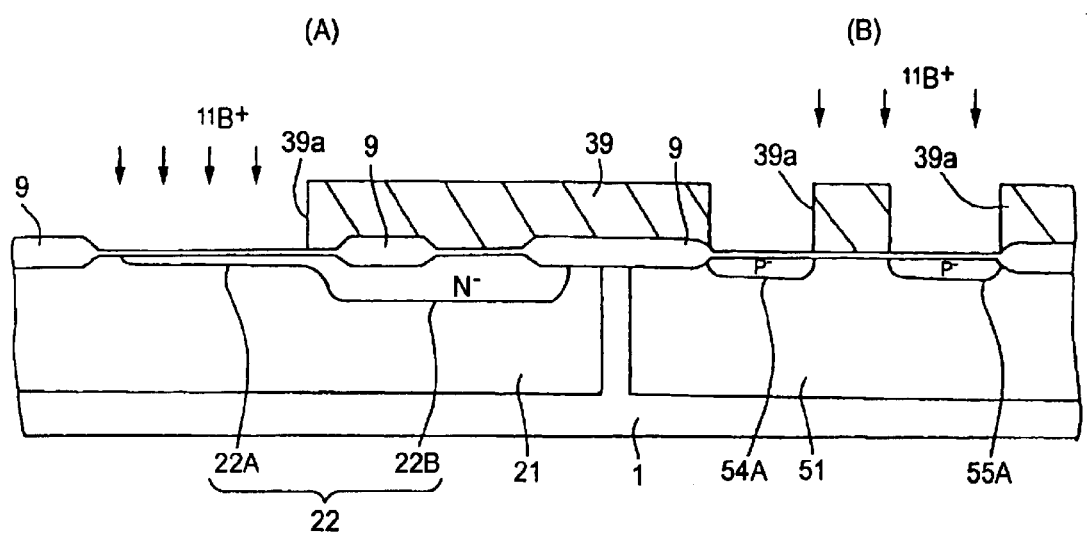
FIGS. 3A and 3B are sectional views showing a semiconductor device manufacturing method according to the first embodiment of the present invention.
Figure 6:
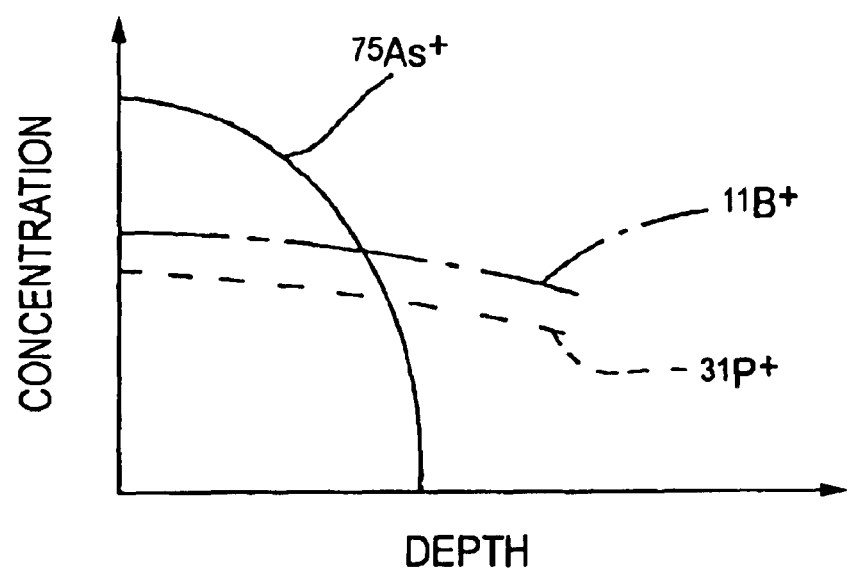
FIG. 6 is a graph showing a concentration distribution of various ions for the purpose of illustration of the drift region forming principle.

Then, in FIG. 3A, a photoresist film 39 having opening portions 39a is formed in the source forming region in the P-type well region 21 and the source/drain forming region in the N-type well region 51 on the substrate 1, and then the P-type impurity (e.g., boron ion) is ion-implanted into the source forming region in the P-type well region 21 and the source/drain forming region in the N-type well region 51 on the surface layer of the substrate by using the photoresist film 39 as a mask and then diffused. Therefore, the second N⁻-type layer 22B in the source forming region can be eliminated by canceling the phosphorus ion, which is employed to form the second N⁻-type layer 22B in the source forming region, with the boron ion, and also the P-type low concentration diffusion regions 54A, 55A (P-) are formed in the source/drain forming region of the P-channel high breakdown voltage MS transistor (B). According to this step, for example, the P-type low concentration diffusion regions 54A, 55A (P-) are formed to have the concentration of about $1\times10^{17}$/cm² by implanting the boron ion by using the accelerating voltage of about 80 KeV at a dose of $8\times10^{12}$/cm² and then annealing at 1100° C. for two hours. FIG. 6 is a graph showing a concentration distribution when the arsenic ion (indicated by a solid line), the phosphorus ion (indicated by a dotted line), and the boron ion (indicated by a dot-dash line) are diffused respectively. As can be seen from FIG. 6, the concentration distribution based on the phosphorus ion in the substrate is overlapped with the concentration distribution based on the boron ion, and thus is canceled.

In this manner, in the present invention, since the boron ion being implanted by the postprocessing is diffused in forming the drift region, the second N⁻-layer 22B which is formed deeply in the substrate on the source forming region side can be canceled based on difference in diffusion coefficients of the arsenic ion and the phosphorus ion, so that only the first N⁻-layer 22A formed in the surface layer of the substrate still remains on the source forming region side. As a result, the N-channel LDMOS transistor (A) in which reduction in ON-resistance can be achieved can be provided by relatively simple manufacturing steps.

Figure 3B:
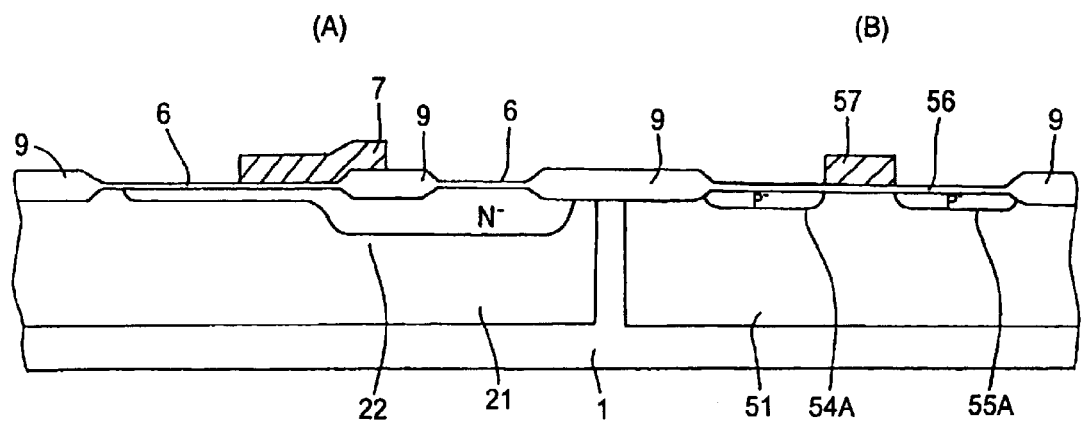

Then, in FIG. 3B, first and second gate insulating films 6, 56 of about 800 Å thickness are formed on the substrate 1, then the gate electrode 7 of about 2500 Å thickness is formed to extend over the first gate insulating film 6 to the LOCOS oxide film 9, and then the second gate electrode 57 of about 2500 Å thickness is formed on the second gate insulating film 56, by forming a conductive film on an entire surface and patterning them. In the first embodiment, P-doped polycrystalline silicon film is used as the conductive film, polyside film formed by forming a tungsten silicide (WSix) film on the P-doped polycrystalline silicon film can be used as the conductive film.

Figure 4A:
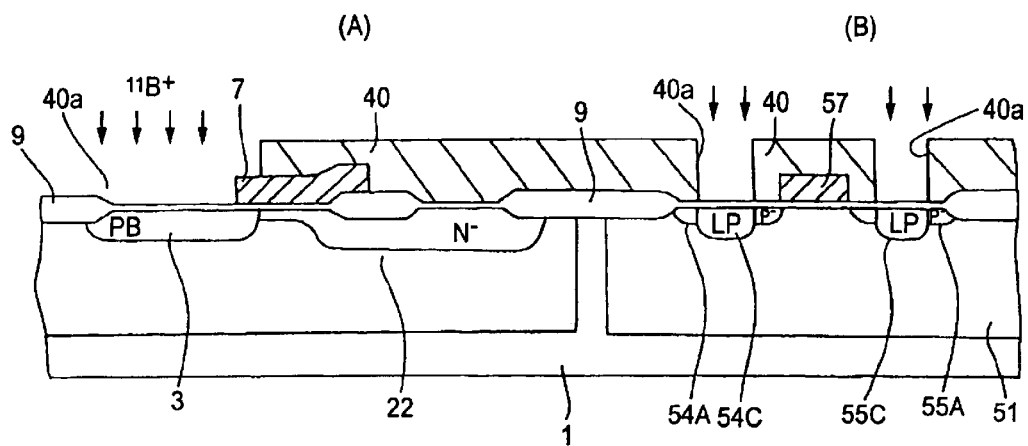
FIGS. 4A and 4B are sectional views showing a semiconductor device manufacturing method according to the first embodiment of the present invention.

Then, in FIG. 4A, a photoresist film 40 having opening portions 40a is formed to cover the gate electrode 7 and the drain forming region of the N-channel LDMOS transistor (A) and the P-channel high breakdown voltage MOS transistor (B) other than a part of the source/drain forming region. Then, the P-type body region 3 and the P-type middle concentration diffusion regions 54c, 55C (LP) are formed by implanting the P-type impurity (e.g., boron ion) while using the photoresist film 40 as a mask and then diffusing it. The P-type body region 3 is located adjacent to one end of the gate electrode 7, and the P-type middle concentration diffusion regions 54C, 55C (LP) are located in a part of the source/drain forming region of the P-channel high breakdown voltage MOS transistor (B). According to this step, for example, the P-type body region 3 and the P-type middle concentration diffusion regions 54C, 55C (LP) are formed to have the concentration of about $5 \times 10^{17}/cm^3$, by implanting the boron ion by using the accelerating voltage of about 40 KeV at a dose of $5 \times 10^{13}/cm^2$ and then annealing at 1050° C. for two hours.

Figure 4B:
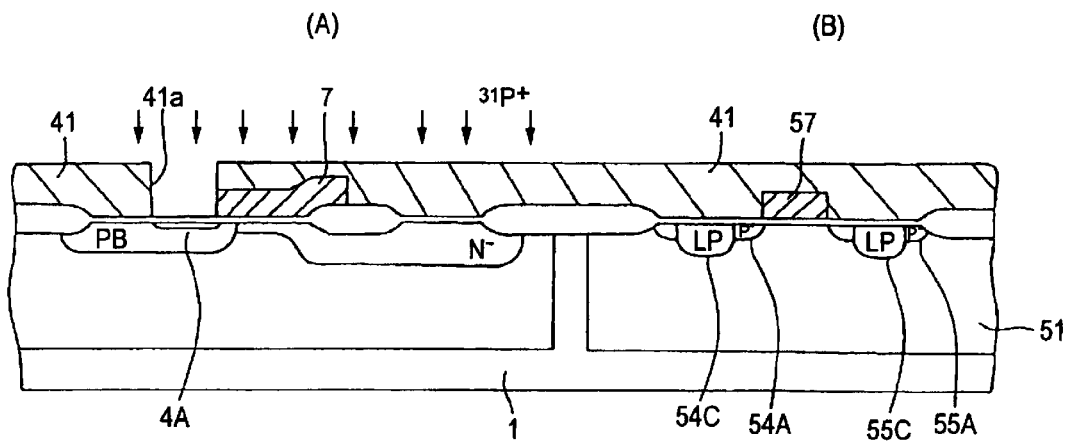

Then, in FIG. 4B, a photoresist film 41 having an opening portion 41a located over the source-forming region which is formed in the P-type body region 3 is formed. Then, the N-type lower concentration diffusion region 4A constituting the source region of the N-channel LDMOS transistor (A) is formed by implanting the N-type impurity (e.g., phosphorus ion) while using the photoresist film 41 as a mask. According to this step, for example, the phosphorus ion is implanted by the accelerating voltage of about 40 KeV at a dose of $3.5 \times 10^{13}/cm^2$.

Figure 5A:
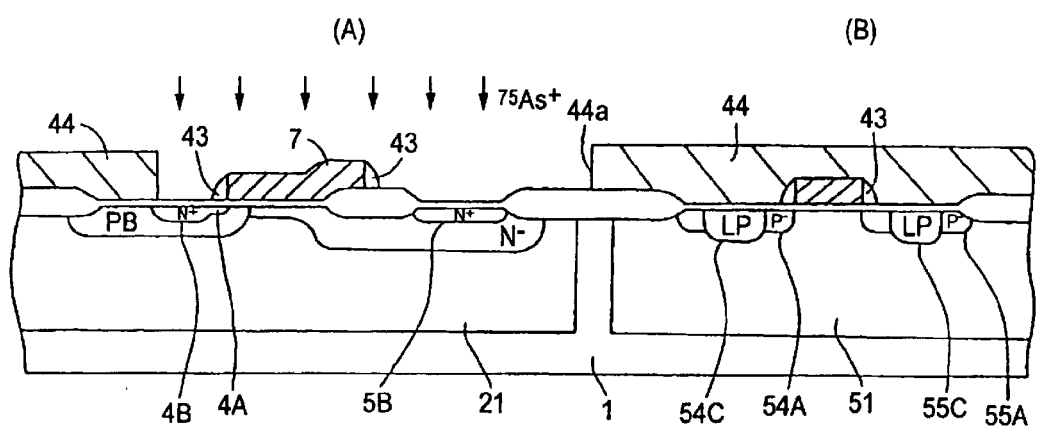
FIGS. 5A and 5B are sectional views showing a semiconductor device manufacturing method according to the first embodiment of the present invention.

Then, in FIG. 5A, sidewall spacer films 43 are formed to cover side wall portions of the first and second gate electrodes 7, 57. Then, a photoresist film 44 having an opening portion 44a which is located aver the source/drain forming region of the N-channel LDMOS transistor (A) is formed. Then, the N-type high concentration diffusion regions 4B, 5B (N+) constituting the source/drain region of the N-channel LDMOS transistor (A) by implanting the N-type impurity (e.g., arsenic ion) while using the photoresist film 44 as a mask. According to this step, for example, the arsenic ion is implanted by the accelerating voltage of about 80 KeV at a dose of $5 \times 10^{15}/cm^2$.

Figure 5B:
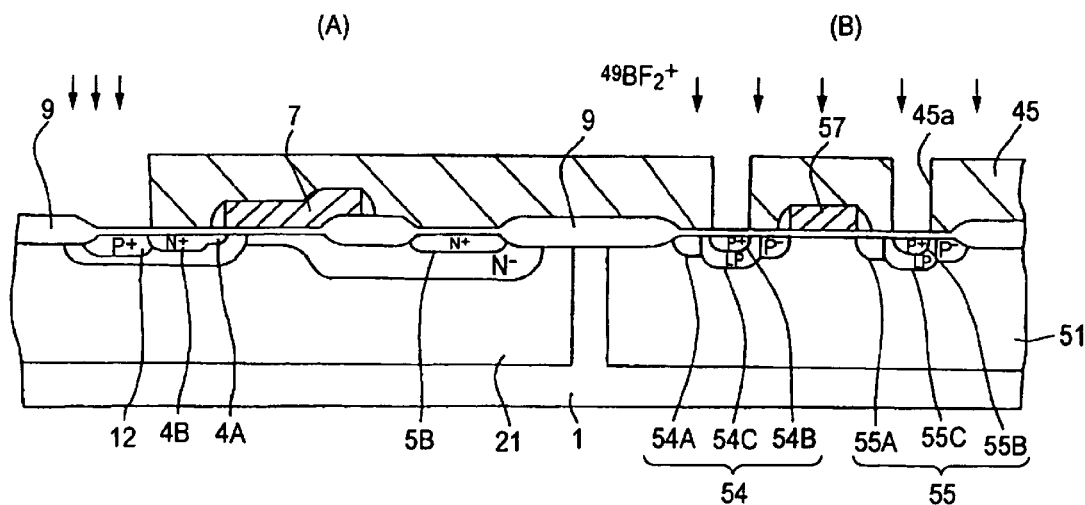

Then, in FIG. 5B, a photoresist film 45 having opening portions 45a is formed. Such opening portions 45a are located over the P-type diffusion region forming region, which supplies the potential to the P-type body region 3 and is adjacent to the N-type diffusion region 4, and a part of the source/drain forming region of the P-channel high breakdown voltage MOS transistor (B) (at least in the region smaller than the P-type middle concentration diffusion regions 54C, 55C (LP)). Then, the P-type diffusion region 12 which is adjacent to the N-type diffusion region 4 and the P-type high concentration diffusion regions 54B, 55B (P+) which are located in the source/drain forming region of the P-channel high breakdown voltage MOS transistor (B) are formed by implanting the P-type impurity (e.g., boron difluoride ion) while using the photoresist film 45 as a mask.

Subsequently, the interlayer insulating film is formed as in the configuration in the prior art, and then the source electrode and the drain electrode are formed via the interlayer insulating film, whereby the semiconductor device can be completed. As described above, according to the semiconductor device manufacturing method of the first embodiment of the present invention, since the N⁻-type layer 22 serving as the drift region can be formed by using difference in diffusion coefficients of the phosphorus ion, the arsenic ion which has the diffusion coefficient different from the phosphorus ion, and the boron ion which has the diffusion coefficient substantially identical to or larger than the phosphorus ion, the manufacturing steps can be made simple. In addition, since the phosphorus ion being located in the deep region can be canceled by the boron ion upon forming the N⁻-type shallow layer 22A serving as the drift region, the N⁻-type layer 22A can be formed shallowly and its donor concentration Nd can be increased larger, and also the acceptor concentration Na in the P-well 21 located on the substrate side, i.e., at the junction portion can be increased. Accordingly, the N⁻-type shallow layer 22A can be put perfectly into the depletion layer by a low voltage, and then clamped at this low voltage. For this reason, even if the voltage higher than this low voltage is applied to the drain, the voltage of the N⁻-type shallow layer 22A is in no way changed. As a result, the higher breakdown voltage can be achieved rather than the N⁻-type shallow layer which is formed by simply implanting the N-type impurity only into the P-well.

By the way, in order to achieve the higher breakdown voltage of the NchDMOS, it is needed that the N⁻-type Resurf layer can be put perfectly into the depletion layer by the low voltage and then clamped at this low voltage. Once the N⁻-type Resurf layer is clamped at a certain voltage, the voltage of the N⁻-type Resurf layer is not changed even if the voltage in excess of this voltage is applied to the drain.

Conversely, in order to reduce the ON-resistance, the resistance of the N⁻-type diffusion layer must be lowered by increasing the concentration of the N⁻-type Resurf layer. In order to change perfectly the N⁻-type diffusion layer of relatively high concentration into the depletion layer by the low voltage, it is effective to form the shallow junction. At the same time, it is effective to increase the concentration on the substrate side.

Figure 21:
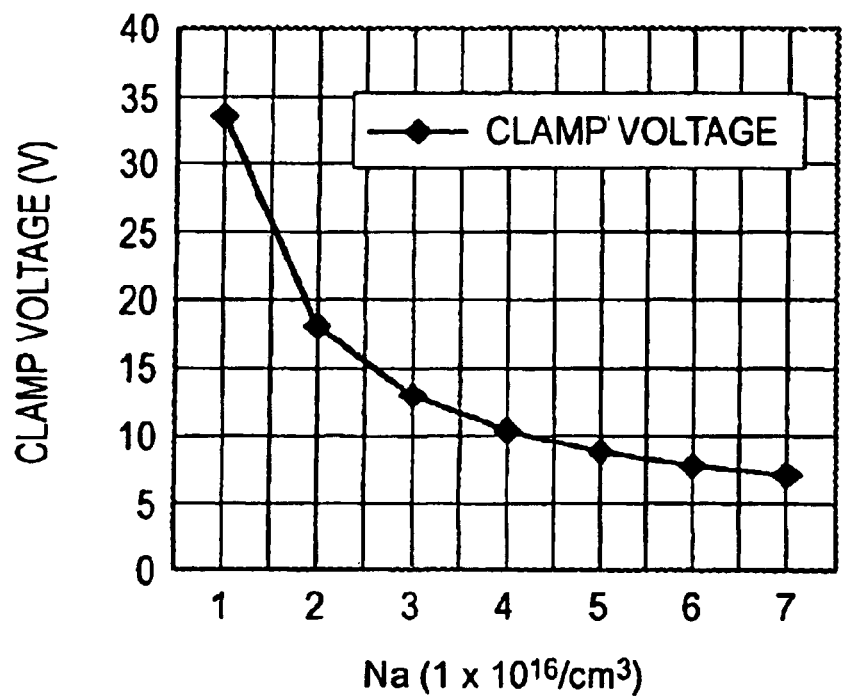
FIG. 21 is a graph showing a relation between a clamp voltage and an acceptor concentration.
Figure 22:
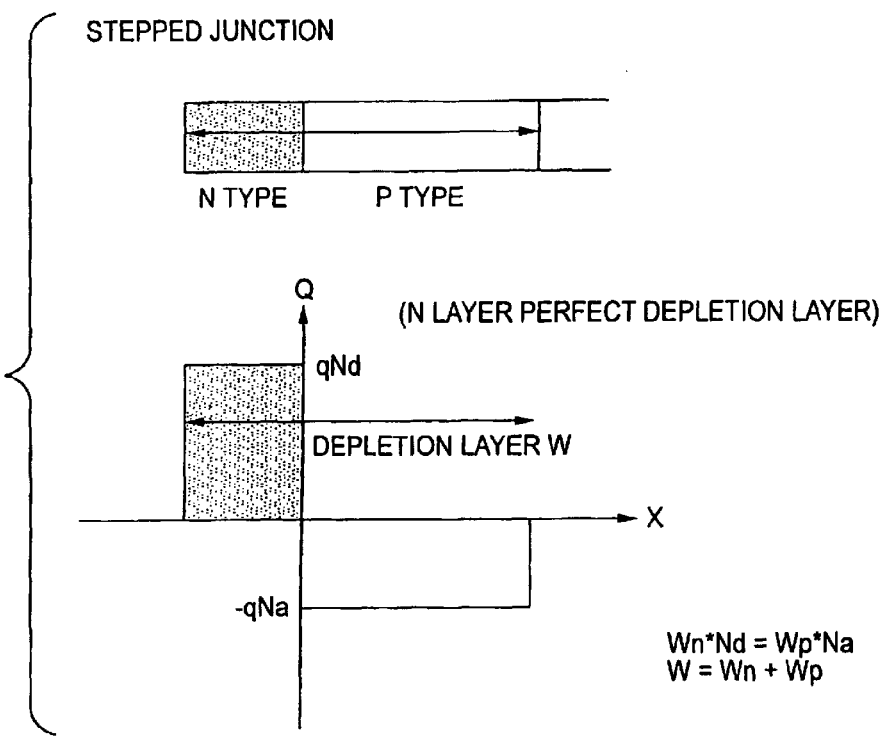
FIG. 22 is a view showing a relation between a concentration of a junction portion of a shallow N-layer and a thickness of a depletion layer caused in the first embodiment of the present invention.

FIG. 21 shows the dependency of the clamp (perfect depletion state) voltage of the N⁻-type Resurf layer upon the substrate concentration (here the acceptor concentration of the P-well: Na) if the junction between the N⁻-type Resurf layer and the substrate is assumed as abrupt junction (FIG. 22).

The clamp (perfect depletion state) voltage is detected when the N⁻-type layer is formed as the diffusion layer of $1 \times 10^{17}/cm^3$ and Xj=0.2 µm. It can be understood that, because of the increase of the substrate concentration (Na), the clamp (perfect depletion state) voltage can be lowered.

If this event is applied to the Nch LDMOS of the semiconductor device shown in FIG. 1, it is possible to say the following. That is, the Resurf action can be produced at the lower voltage by increasing the substrate concentration by using the P⁻-type layer (shown as a broken line in FIG. 1) as well as forming the junction depth of the N⁻-type layer at the shallow position. In this manner, since the shallow and high concentration drift region can be formed by implanting the acceptor impurity to cancel the donor impurity after the donor impurity has been implanted once, the higher breakdown voltage can be achieved rather than the case where the shallow drift region is formed by implanting shallowly the donor impurity.

Further, since the boron ion implanted to form the N⁻-type layer 22 can be implanted by the same step as the ion-implanting step which is applied to form the P-type low concentration diffusion regions 54A, 55A (P-) constituting the P-type diffusion regions 54, 55 (P-) of the P-channel high breakdown voltage MOS transistor (B), the number of manufacturing steps is never increased in vain.

Furthermore, since the P-type middle concentration diffusion regions 54C, 55C (LP) constituting the P-type diffusion regions 54, 55 of the P-channel high breakdown voltage MOS transistor (B) can be formed by the same step as the ion-implanting step, which is applied to form the P-type body region 3, out of the LDMOS transistor forming steps employed when the N-channel LDMOS transistor (A) and the P-channel high breakdown voltage MOS transistor (B) are fabricated, the ON-resistance of the P-channel high breakdown voltage MOS transistor (B) can be further lowered rather than the structure in the prior art. Besides, since the ion-implanting step of the steps of manufacturing the N-channel LDMOS transistor (A) can also be used as the present step, there is no situation that the number of manufacturing steps is increased meaninglessly.

Figure 7:
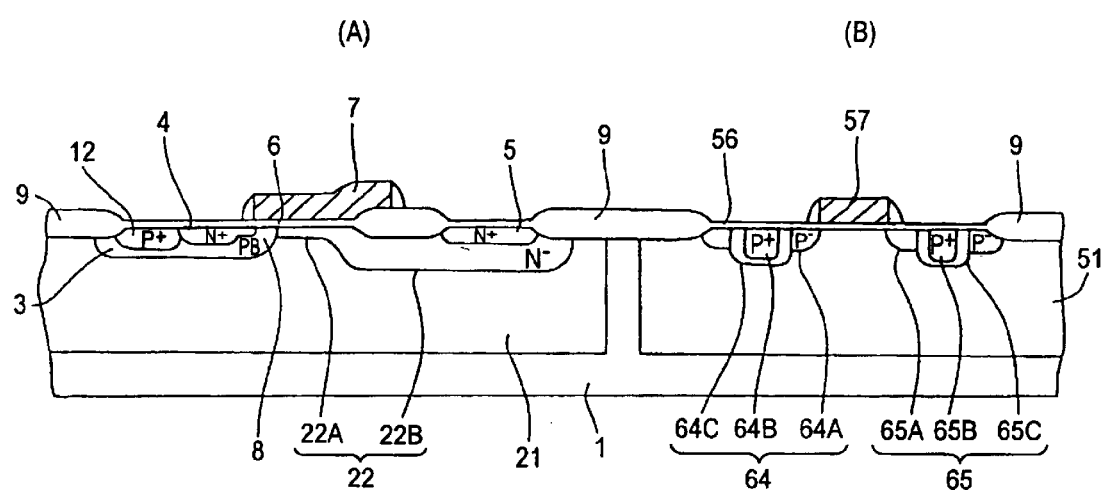
FIG. 7 is a sectional view showing a semiconductor device manufacturing method according to a second embodiment of the present invention.

FIG. 7 is a view showing a semiconductor device manufacturing method according to a second embodiment of the present invention. A feature of the second embodiment different from the first embodiment is a relation between the P-type low concentration diffusion regions 64A, 65A and the P-type high concentration diffusion regions 64B, 65B both constituting the P-type diffusion regions 64, 65 of the P-channel high breakdown voltage MOS transistor (B). That is, the P-type high concentration diffusion regions 64B, 65B are formed up to a depth which is deeper than the forming depth of the P-type low concentration diffusion regions 64A, 65A. And, like the first embodiment, the P-type middle concentration diffusion regions 64C, 65C are formed wider and deeper than the P-type high concentration diffusion regions 64B, 65B.

Next, a third embodiment of the present invention will be explained hereunder.

Figure 8:
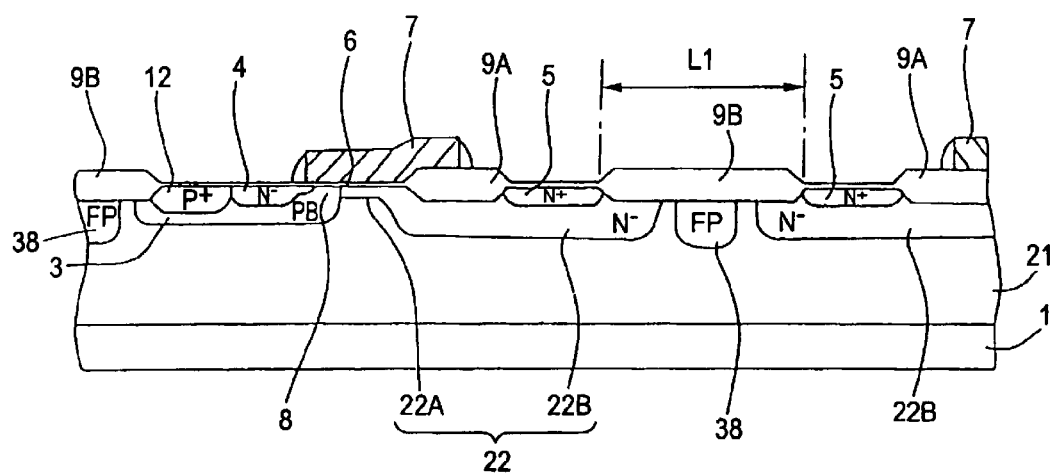
FIG. 8 is a sectional view showing a semiconductor device manufacturing method according to a third embodiment of the present invention.
Figure 9:
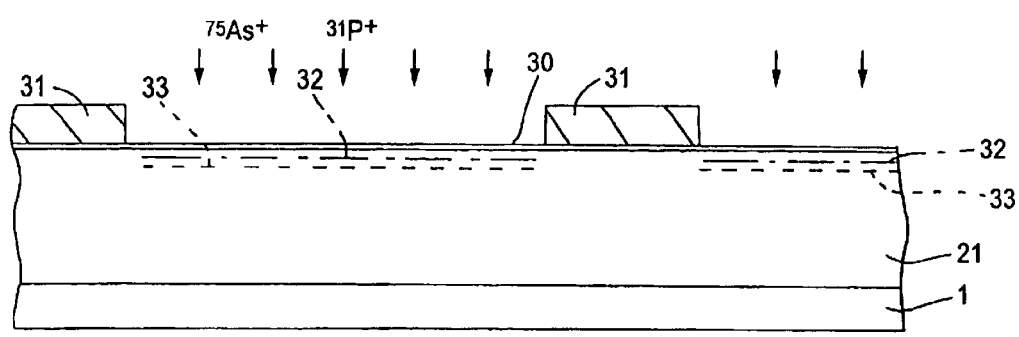
FIG. 9 is a sectional view showing a semiconductor device manufacturing method according to the third embodiment of the present invention.
Figure 10:
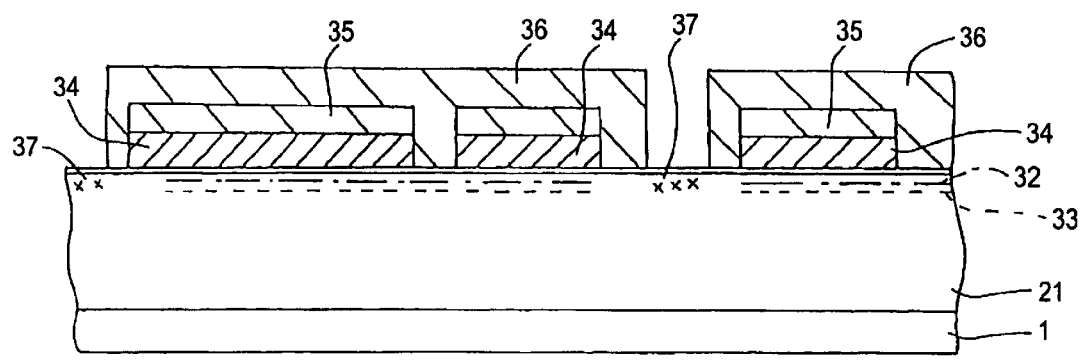
FIG. 10 is a sectional view showing a semiconductor device manufacturing method according to the third embodiment of the present invention.
Figure 11:
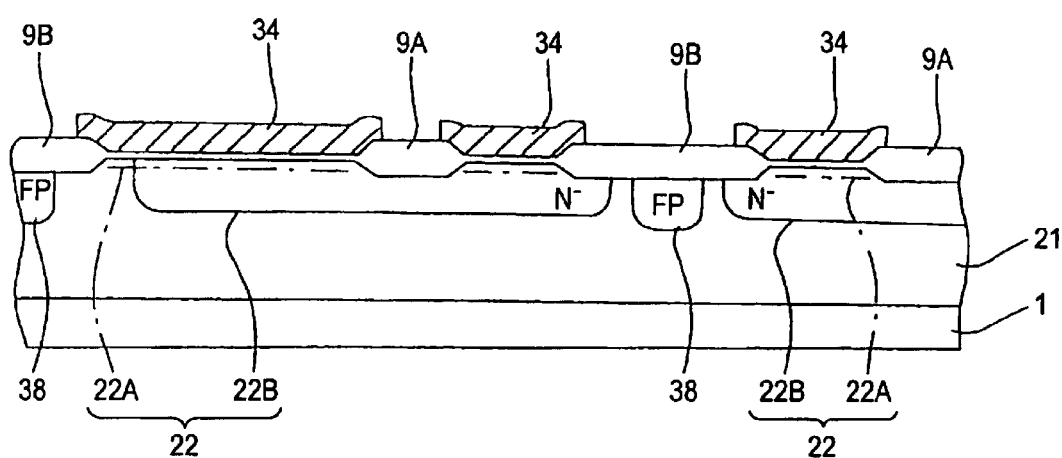
FIG. 11 is a sectional view showing a semiconductor device manufacturing method according to the third embodiment of the present invention.
Figure 12:
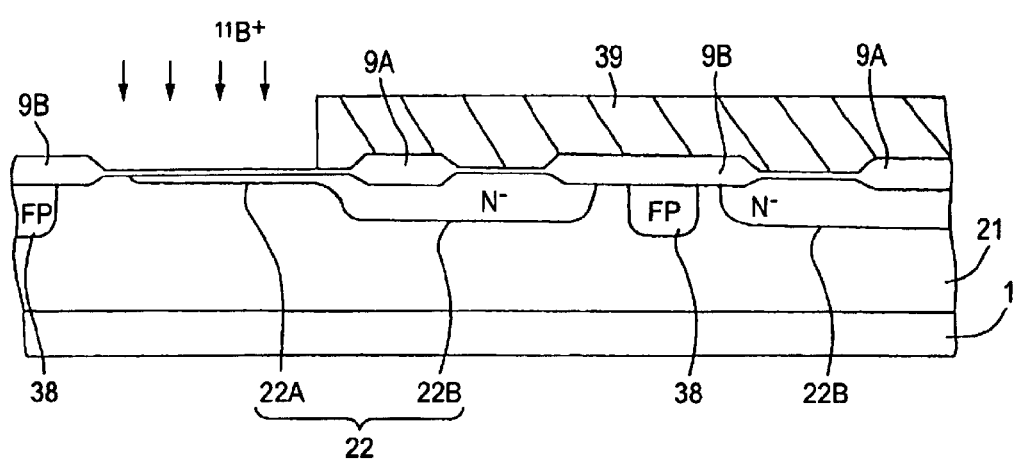
FIG. 12 is a sectional view showing a semiconductor device manufacturing method according to the third embodiment of the present invention.
Figure 13:
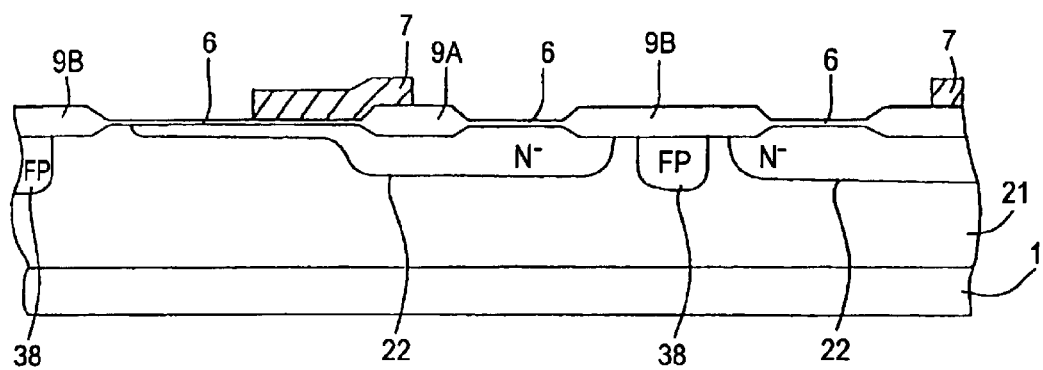
FIG. 13 is a sectional view showing a semiconductor device manufacturing method according to the third embodiment of the present invention.
Figure 14:
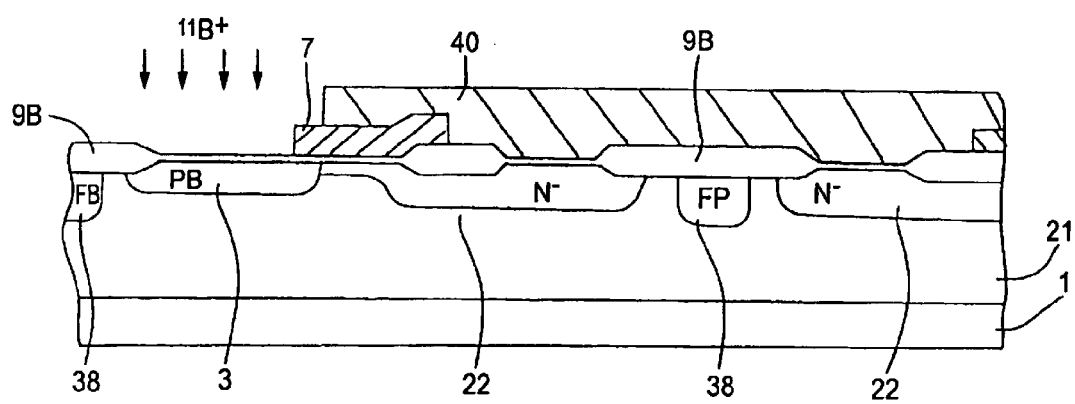
FIG. 14 is a sectional view showing a semiconductor device manufacturing method according to the third embodiment of the present invention.
Figure 15:
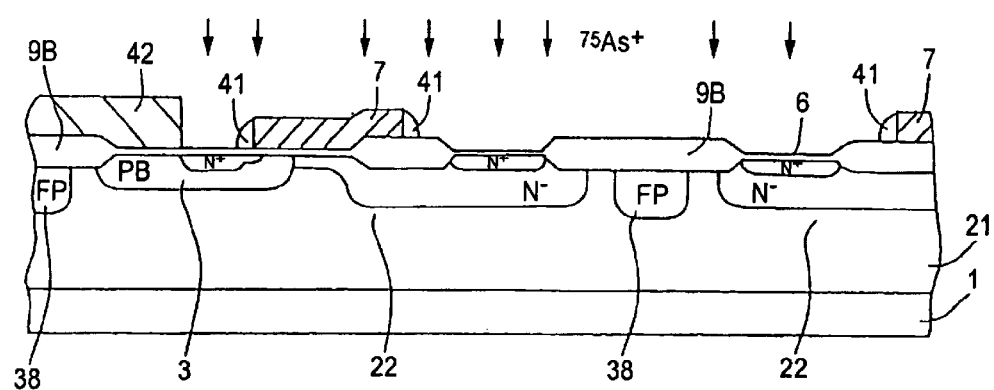
FIG. 15 is a sectional view showing a semiconductor device manufacturing method according to the third embodiment of the present invention.
Figure 16:
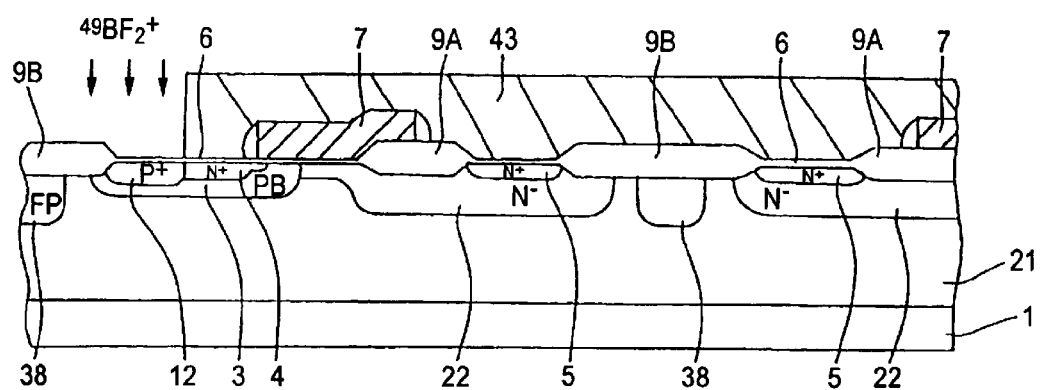
FIG. 16 is a sectional view showing a semiconductor device manufacturing method according to the third embodiment of the present invention.

FIG. 8 is a sectional view showing an LDMOS transistor according to the third embodiment. The N-channel LDMOS transistor structure is shown as an example. Although the explanation of the P-channel LDMOS transistor structure is omitted, it is well known that such structure has the similar structure except for the different conductivity type. In this case, same symbols are affixed to constituent elements similar to those in the prior art, and their explanation will be simplified.

In FIG. 8, 1 denotes a conductivity type, e.g., P-type semiconductor substrate, and 21 denotes the P-type well region. The N⁻-type layer 22 as well as the P-type body region 3 is formed in the P-type well region 21. The N-type diffusion region 4 is formed in the P-type body region 3, and the N-type diffusion region 5 is formed in the N⁻-type layer 22. The gate electrode 7 is formed on the surface of the substrate via the gate insulating film 6. The channel region 8 is formed in the surface region of the P-type body region 3 immediately below the gate electrode 7.

The N-type diffusion region 4 acts as the source region and the N-type diffusion region 5 acts as the drain region, and the N⁻-type layer 22 under the first LOCOS oxide film 9A acts as the drift region.

In addition, a plurality of LDMOS transistors having the above structure are arranged via the second LOCOS oxide film 9B serving as the element isolation film, and a channel stopper layer 38 is formed under the second LOCOS oxide film 9B. Further the plurality of transistors arranged via the second LOCOS oxide film 9B serving as the element isolation film are not limited to the LDMOS transistors described as above, and the present invention is applicable to a LDMOS transistors having the above structure and a MOS transistor having a high breakdown voltage arranged via the second LOCOS oxide film 9B serving as the element isolation film.

A feature of the third embodiment resides in that the channel stopper layer 38 is formed under the second LOCOS oxide film 9B in the structure in which a plurality of LDMOS transistors having the above structure are arranged via the second LOCOS oxide film 9B serving as the element isolation film.

Further, spread of the depletion layer in the diffusion regions 4, 5 of the LDMOS transistors which are positioned adjacently via the second LOCOS oxide film 9B can be suppressed by the channel stopper layer 38 formed under the second LOCOS oxide film 9B. Therefore, the second LOCOS oxide film 9B per se can be reduced in size and thus the higher integration can be achieved. In addition, the higher integration is made possible by employing the N⁻-type layer 22 in place to the N⁻-type layer 22 in the prior art structure. According to such structure, a size of the second LOCOS oxide film 9B per se can be reduced up to the size L1 (about 5 μm to 8 μm) (the conventional size L2 is about 10 μm to 30 μm). Besides, the higher breakdown voltage can be achieved by increasing a distance from an end portion of the second LOCOS oxide film 9B to the channel stopper layer 38 up to about 2 μm to 3 μm.

FIGS. 8 to 16 are views showing manufacturing steps of manufacturing a plurality of LDMOS transistors.

These steps are almost similar to those shown in FIGS. 2 to 5 in the first embodiment. However, in FIG. 10, a second photoresist film 36 is formed on the substrate 1 to cover a silicon nitride film 34 which is patterned via a first photoresist film 35, and then a channel stopper layer forming ion-implantation layer 37 is formed by ion-implanting the P-type impurity (e.g., boron ion) into a certain region of the substrate surface (forming region in which a channel stopper layer 38 is formed by the postprocessing) while using the second photoresist film 36 as a mask. According to this step, for example, the boron ion is implanted by the accelerating voltage of about 60 KeV at a dose of 5×10¹³/cm². Then, since the ion implantation to form the channel stopper layer of the LDMOS transistor is carried out by the same step as the step of forming the channel stopper layer formed in the normal high breakdown MOS transistor, the number of manufacturing steps is never increased in vain.

Because remaining steps correspond to those in the first embodiment, their explanation will be omitted. In the third embodiment, the higher breakdown voltage can be attained by increasing the distance from an end portion of the second LOCOS oxide film 9B to the channel stopper layer 38 up to about 2 μm to 3 μm.

According to this method, in addition to the advantage achieved by the above first embodiment, the number of manufacturing steps is never increased since the step of forming the channel stopper layer 38 can be carried out simultaneously with the step of forming the channel stopper layer of the normal high breakdown voltage MOS transistor.

Figure 17:
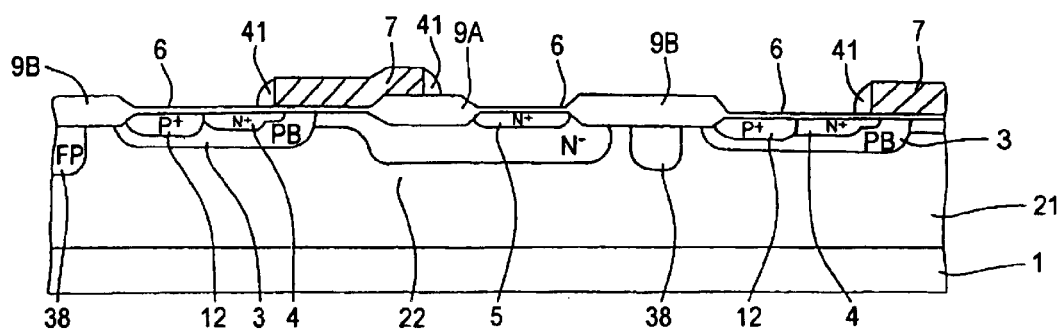
FIG. 17 is a sectional view showing a semiconductor device manufacturing method according to a fourth embodiment of the present invention.
Figure 18:
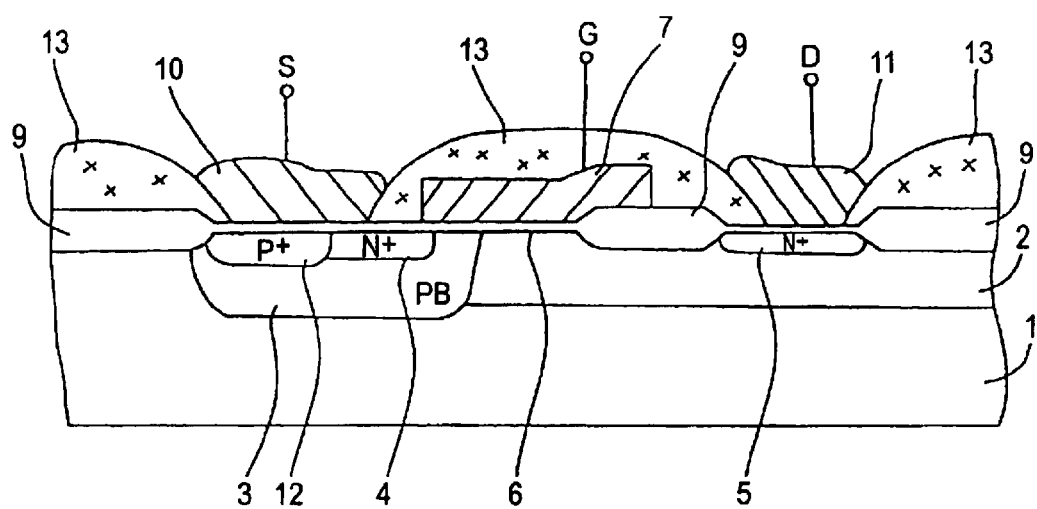
FIG. 18 is a view showing a semiconductor device in the prior art.
Figure 19A:
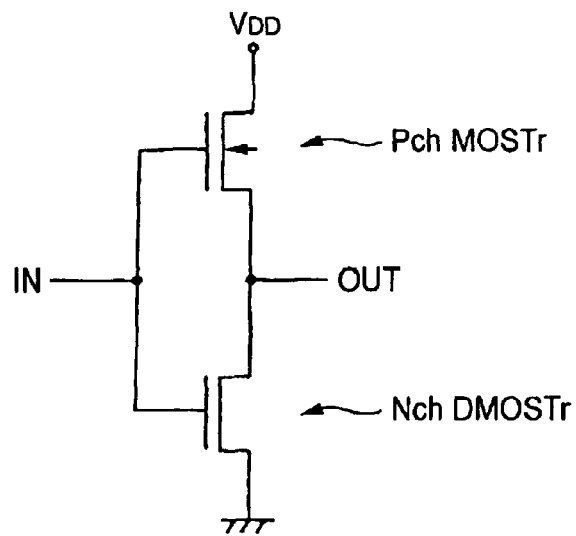
FIGS. 19A and 19B are views showing the semiconductor device in the prior art.
Figure 19B:
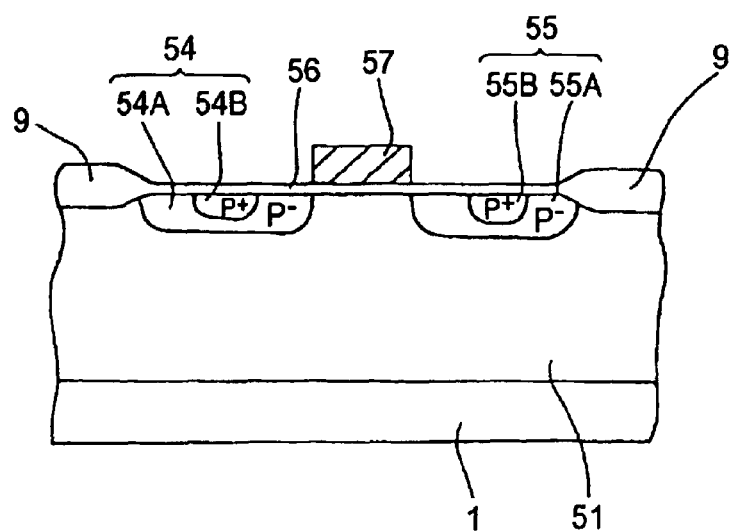
Figure 20:
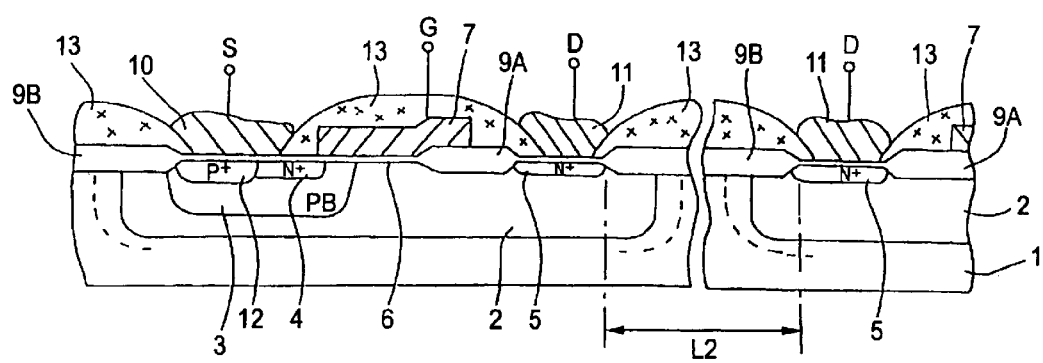
FIG. 20is a view showing the semiconductor device in the prior art.

FIG. 17 is a sectional view showing a semiconductor device according to a fourth embodiment of the present invention. A feature of the fourth embodiment different from the foregoing third embodiment is that the diffusion regions 4, 5 of a plurality of LDMOS transistors being arranged via the element isolation film 9B are reversely arranged. The further higher integration can be achieved by employing such arrangement. More particularly, because the diffusion region (source region) 4 has the fixed potential, the element isolation film 9B can be reduced in size in the configuration in which the diffusion region (source region) 4 and the diffusion region (drain region) 5 are positioned adjacently rather than the configuration in which the diffusion regions (drain regions) 5 whose potential is varied are positioned adjacently via the element isolation film 9B.

It is needless to say that the above feature to enable the high integration is effective if such feature is applied to the LDMOS transistor having the conventional structure, i.e., the N-type well region 2 is formed uniformly up to the same depth position.

Industrial Applicability

According to the semiconductor device of the present invention, since the low concentration layer serving as the drift region is formed shallowly at least under the gate electrode but formed deeply in the neighborhood of the drain region, the higher breakdown voltage and reduction in the ON-resistance can be achieved. Since the drift region can be formed by using difference in diffusion coefficients of the phosphorus ion, the arsenic ion which has the diffusion coefficient different from the phosphorus ion, and the boron ion which has the diffusion coefficient substantially identical to or larger than the phosphorus ion, the manufacturing steps can be made simple. In addition, since the boron ion implanted to form this drift region can be implanted by the same step as the ion-implanting step which is applied to form the P-type low concentration diffusion regions of the P-channel high breakdown voltage MS transistor, the number of manufacturing steps is never increased in vain.

In the case that a plurality of semiconductor devices having the above structure are arranged via the element isolation film, a size of the element isolation film can be reduced and high integration can be achieved by forming a channel stopper under the element isolation film.

Further since a channel stopper layer can be formed by the same step as the step of forming a channel stopper of the MOS transistor having a high breakdown voltage, the number of manufacturing steps is never increased in vain.

In addition, since the p-type middle concentration diffusion regions of the p-channel high breakdown voltage ms transistor can be formed by utilizing the DMOS transistor forming steps employed when the n-channel LDMOS transistor and the p-channel high breakdown voltage MOS transistor are fabricated, the lower on-resistance can be achieved in the p-channel high breakdown voltage MOS transistor rather than the structure in the prior art.

Moreover, since the ion-implanting step of the steps of manufacturing the n-channel LDMOS transistor can also be utilized as the step of forming the p-type middle concentration diffusion regions, the number of manufacturing steps are in no means increased uselessly.

What is claimed is:

1. A semiconductor device comprising a source region, a channel region, a drain region, a gate electrode disposed above the channel region, and a two-part drift region disposed adjacent to the channel region and extending to and below the drain region, wherein a first part of said drift region is formed shallowly below at least a substantial part of the gate electrode, and said first part has substantially uniform depth under said gate, wherein the entire first part of said drift region is located below said gate electrode, and said first part has a first dopant concentration; and wherein a second part of said drift region, having substantially uniform depth, is formed more deeply than said first part and is located below the drain region, and the second part has a second dopant concentration, wherein the first dopant concentration is higher than the second dopant concentration.

2. A semiconductor device comprising:

a first conductivity type well region formed in a first conductivity type semiconductor substrate;

a gate electrode formed on the substrate through a gate insulating film;

a first conductivity type body region formed to be adjacent to the gate electrode;

a second conductivity type source region and a channel region formed in the first conductivity type body region;

a second conductivity type drain region formed at a position remote from the first conductivity type body region; and a two-part, second conductivity type drift region, with a first part having substantially uniform depth formed shallowly from the channel region to the drain region, at least below a substantial part of the gate electrode, wherein the entire first part of said drift region is located below said gate electrode, said first part having a first dopant concentration, and wherein a second part of said drift region below the drain region, said second part having substantially uniform depth, being formed more deeply than said first part, and having a second dopant concentration, wherein the first dopant concentration is higher than the second dopant concentration.

3. A semiconductor device according to claim 2, wherein the second conductivity type drift region is doped with at least two kinds of second conductivity type impurities which have different diffusion coefficients, and at least one kind of first conductivity type impurity which has a diffusion coefficient substantially equal to or larger than the diffusion coefficient of at least one kind of second conductivity type impurity; and the first conductivity type impurity cancels the second conductivity type impurities in the region below said shallowly formed first part.

4. A semiconductor device according to claim 3, wherein arsenic and phosphorus are the second conductivity type impurities and boron is the first conductivity type impurity.

5. A semiconductor device comprising a first MOS transistor having a source region, a channel region, a drain region, a gate electrode formed on the channel region, and a drift region formed between the channel region and the drain region, and a second MOS transistor having a source region, a channel region, a drain region, and a gate electrode formed on the channel region, wherein the drift region of the first MOS transistor is formed shallowly at a uniform depth at least below a substantial part of the gate electrode but formed more deeply below the drain region, wherein substantially the entire shallow part of said drift region is located below said gate electrode, the shallow part having a first dopant concentration and the deep part having a second dopant concentration, wherein the first dopant concentration is higher than the second dopant concentration, and a source/drain region of the second MOS transistor consists of a low concentration source-drain region, a high concentration source-drain region, and a middle concentration source/drain region whose concentration is higher than that of the low concentration source/drain region but lower than that of the high concentration source/drain region.

6. A semiconductor device comprising a first MOS transistor and a second MOS transistor formed on a first conductivity type semiconductor substrate;

wherein the first MOS transistor includes, a first conductivity type well region formed in the semiconductor substrate, a first gate electrode formed on the first conductivity type well region through a first gate insulating film, a first conductivity type body region formed to be adjacent to the first gate electrode, a second conductivity type source region and a channel region formed in the first conductivity type body region, a second conductivity type drain region formed at a position remote from the first conductivity type body region, and a second conductivity type drift region formed from the channel region to the drain region, said second conductivity type drift region being formed shallowly at least below a substantial part of the gate electrode, and formed more deeply below the drain region, wherein substantially the entire shallow part of said drift region is located below said gate electrode, the shallow part having a first dopant concentration and the deep part having a second dopant concentration, wherein the first dopant concentration is higher than the dopant second concentration, and wherein the second MOS transistor includes, a second conductivity type well region formed in the semiconductor substrate, a second gate electrode formed on the second conductivity type well region through a second gate insulating film, and a source/drain region consisting of a low concentration source/drain region formed to be adjacent to the second gate electrode, a high concentration source/drain region, and a middle concentration source/drain region whose concentration is higher than that of the low concentration source/drain region but lower than that of the high concentration source/drain region.

7. A semiconductor device according to claim 6, wherein the first MOS transistor consists of an N-channel LDMOS transistor, and the second MOS transistor consists of a P-channel high breakdown voltage MOS transistor.

8. A semiconductor device according to claim 1, wherein the semiconductor device is arranged in plural via a element isolation film, and a channel stopper layer is formed under the element isolation film.

9. A semiconductor device according to claim 2, wherein the second conductive type drift region is adjacent to the first conductive type body region.

10. A semiconductor device in accordance with claim 4, wherein the arsenic is implanted in the semiconductor substrate by an accelerating voltage of about 160 KeV at a dose of $3 \times 10^{12}/cm^2$.

11. A semiconductor device in accordance with claim 5, wherein the low concentration source/drain region is formed by implanting boron in the semiconductor substrate at an accelerating voltage of about 80 KeV at a dose of $8 \times 10^{12}/cm^2$.

12. A semiconductor device in accordance with claim 5, wherein the middle concentration source/drain region is formed by implanting boron in the semiconductor substrate at an accelerating voltage of about 40 KeV at a dose of $5 \times 10^{13}/cm^2$.

13. A semiconductor device in accordance with claim 2, wherein the gate electrode has a thickness of about 2500 Å.

14. A semiconductor device in accordance with claim 1, wherein the source region is formed by implanting phosphorous in the semiconductor substrate at an accelerating voltage of about 40 KeV at a dose of $3.5 \times 10^{13}/cm^2$.

15. A semiconductor device in accordance with claim 1, wherein the source region is formed by implanting phosphorous in the diffusion region at an accelerating voltage of about 40-KeV at a dose of $3.5 \times 10^{13}/cm^2$ and by implanting arsenic at an accelerating voltage of about 80 KeV at a dose of $5 \times 10^{15}/cm^2$, and the drain region is formed by implanting arsenic at an accelerating voltage of about 80 KeV at a dose of $5 \times 10^{15}/cm^2$.

16. A semiconductor device in accordance with claim 1, wherein the drift region has an impurity concentration of about $1 \times 10^{17}/cm^3$.

17. A semiconductor device in accordance with claim 8, wherein the size of the element isolation film is about 5 $\mu$m to 8 $\mu$m and a distance from an end of the element isolation film to the channel stopper layer is about 2 $\mu$m to 3 $\mu$m.

18. A semiconductor device in accordance with claim 8, wherein the channel stopper layer is formed in the semiconductor substrate by implanting boron at an accelerating voltage of about 60 KeV at a dose of $5 \times 10^{13}/cm^2$.

* * * * *